(12) United States Patent
Sun et al.

(10) Patent No.: US 11,108,005 B2
(45) Date of Patent: Aug. 31, 2021

(54) ARRAY SUBSTRATE, STRETCHABLE DISPLAY DEVICE, AND METHOD FOR MANUFACTURING ARRAY SUBSTRATE

(71) Applicant: BOE TECHNOLOGY GROUP CO., LTD., Beijing (CN)

(72) Inventors: Zhongyuan Sun, Beijing (CN); Jinxiang Xue, Beijing (CN); Hao Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/834,150

(22) Filed: Mar. 30, 2020

(65) Prior Publication Data
US 2021/0057659 A1 Feb. 25, 2021

(30) Foreign Application Priority Data
Aug. 19, 2019 (CN) .......................... 201910763153.4

(51) Int. Cl.
*H01L 51/00* (2006.01)
*G09G 3/3258* (2016.01)
(Continued)

(52) U.S. Cl.
CPC ....... *H01L 51/0097* (2013.01); *G09G 3/3258* (2013.01); *H01L 27/3276* (2013.01);
(Continued)

(58) Field of Classification Search
CPC ..... H01L 51/0097; H01L 51/56; H01L 51/52; H01L 51/0017; H01L 27/3276;
(Continued)

(56) References Cited

U.S. PATENT DOCUMENTS

2015/0380679 A1* 12/2015 Fujiyoshi ............ H01L 51/5253
257/99
2016/0240802 A1 8/2016 Lee
(Continued)

FOREIGN PATENT DOCUMENTS

| CN | 107221550 A | 9/2017 |
| CN | 107705757 B | 10/2019 |
| TW | 201640708 A | 11/2016 |

*Primary Examiner* — Kyoung Lee
*Assistant Examiner* — Christina A Sylvia
(74) *Attorney, Agent, or Firm* — Womble Bond Dickinson (US) LLP

(57) ABSTRACT

The present disclosure provides an array substrate, a stretchable display device, and a method for manufacturing an array substrate. The array substrate includes: a display area; a circuit area configured to provide an electrical signal to the display area; and a protection area including a plurality of island-shaped protection blocks, a plurality of first connection bridges and a plurality of second connection bridges, wherein each of the plurality of first connection bridges is configured to connect two adjacent island-shaped protection blocks of the plurality of island-shaped protection blocks, and the plurality of second connection bridges are configured to connect the protection area and the circuit area, and wherein the plurality of first connection bridges include a first flexible substrate, and the plurality of second connection bridges include a second flexible substrate.

14 Claims, 12 Drawing Sheets

(51) Int. Cl.
*H01L 27/32* (2006.01)
*H01L 51/56* (2006.01)
*G09F 9/30* (2006.01)

(52) U.S. Cl.
CPC .............. *H01L 51/56* (2013.01); *G09F 9/301* (2013.01); *G09G 2380/02* (2013.01)

(58) Field of Classification Search
CPC ........... H01L 27/3244; H01L 2227/326; H01L 2251/5338; G09G 3/3258; G09G 2380/02; G09G 2380/3208; Y02E 10/549
See application file for complete search history.

(56) References Cited

U.S. PATENT DOCUMENTS

| | | |
|---|---|---|
| 2017/0169918 A1* | 6/2017 | Park .......................... H01B 7/06 |
| 2017/0279057 A1 | 9/2017 | Park et al. |
| 2018/0114825 A1* | 4/2018 | Hong .................... H01L 27/326 |
| 2019/0164497 A1 | 5/2019 | Wang |
| 2020/0028102 A1* | 1/2020 | Kim .................... H01L 51/5237 |
| 2020/0403170 A1* | 12/2020 | Xue ........................ G09G 3/035 |

* cited by examiner

ARRAY SUBSTRATE, STRETCHABLE DISPLAY DEVICE, AND METHOD FOR MANUFACTURING ARRAY SUBSTRATE

RELATED APPLICATIONS

This application claims priority from Chinese Patent Application No. 201910763153.4 filed on Aug. 19, 2019, the entire content of which is incorporated herein by reference.

TECHNICAL FIELD

The present disclosure relates to the field of display technologies, and in particular, to an array substrate, a stretchable display device, and a method for manufacturing an array substrate.

BACKGROUND

Organic light-emitting diodes have the advantages of self-luminescence, ultra-light weight, ultra-thin thickness, fast response speed, wide viewing angle, low power consumption, etc. At the same time, compared to liquid crystal displays, organic stretchable display devices can be bent and have a wider application range. The development of organic stretchable display devices has accumulated technology for several years, and has gradually evolved from current bendable product forms to foldable and even stretchable products.

SUMMARY

According to one aspect of the present disclosure, there is provided an array substrate comprising: a display area; a circuit area configured to provide an electrical signal to the display area; and a protection area comprising a plurality of island-shaped protection blocks, a plurality of first connection bridges and a plurality of second connection bridges, wherein each of the plurality of first connection bridges is configured to connect two adjacent island-shaped protection blocks of the plurality of island-shaped protection blocks, and the plurality of second connection bridges are configured to connect the protection area and the circuit area, and wherein the plurality of first connection bridges comprise a first flexible substrate, and the plurality of second connection bridges comprise a second flexible substrate.

In some embodiments of the present disclosure, the display area comprises a plurality of island-shaped display blocks, a plurality of third connection bridges, and a plurality of fourth connection bridges, each of the plurality of third connection bridges is configured to connect two adjacent island-shaped display blocks of the plurality of island-shaped display blocks, the plurality of fourth connection bridges are configured to connect the display area and the circuit area, the plurality of third connection bridges comprise a third flexible substrate, and the plurality of fourth connection bridges comprise a fourth flexible substrate.

In some embodiments of the present disclosure, the circuit area comprises a plurality of island-shaped circuit blocks and a plurality of fifth connection bridges, each of the plurality of fifth connection bridges is configured to connect two adjacent island-shaped circuit blocks of the plurality of island-shaped circuit blocks, and the plurality of fifth connection bridges comprise a fifth flexible substrate.

In some embodiments of the present disclosure, the array substrate further comprises a driver IC, the circuit area being located on the periphery of the display area, the protection area being located on a side of the circuit area away from the display area, and the driver IC being located on a first side of the circuit area away from the display area, and the protection area comprising a first protection area, a second protection area, and a third protection area, wherein the first protection area is located on a second side of the circuit area away from the display area, and the second side is opposite to the first side; the second protection area and the third protection area are respectively located on a third side and a fourth side of the circuit area away from the display area, and the third side is opposite to the fourth side.

In some embodiments of the present disclosure, each of the plurality of island-shaped protection blocks comprises: a first island-shaped flexible substrate; and a dielectric layer on the first island-shaped flexible substrate.

In some embodiments of the present disclosure, each of the plurality of island-shaped display blocks comprises: a second island-shaped flexible substrate; a pixel driving circuit on the second island-shaped flexible substrate; a light-emitting pixel on the pixel driving circuit configured to emit light in response to an electrical signal received from the pixel driving circuit; and an encapsulation layer on the light-emitting pixel.

In some embodiments of the present disclosure, the plurality of island-shaped circuit blocks comprise: a first island-shaped circuit block provided with a gate driving circuit; a second island-shaped circuit block configured to provide a first power supply voltage; and a third island-shaped circuit block configured to provide a second power supply voltage In some embodiments of the present disclosure, the gate driving circuit comprises a light emitting signal driving circuit and a scanning signal driving circuit, and the first island-shaped circuit block comprises a light emitting signal driving circuit circuit block and a scanning signal driving circuit circuit block.

In some embodiments of the present disclosure, each of the plurality of island-shaped circuit blocks comprises a third island-shaped flexible substrate, the first island-shaped circuit block comprises the gate driving circuit on the third island-shaped flexible substrate; the second island-shaped circuit block comprises a first power supply signal line on the third island-shaped flexible substrate; and the third island-shaped circuit block comprises a second power supply signal line on the third island-shaped flexible substrate.

In some embodiments of the present disclosure, the gate driving circuit comprises a light emitting signal driving circuit and a scanning signal driving circuit, the first island-shaped circuit block comprises a light emitting signal driving circuit circuit block and a scanning signal driving circuit circuit block, at least one of the plurality of fifth connection bridges connecting the first island-shaped circuit block and the second island-shaped circuit block that are adjacent comprises a first connection wire on the fifth flexible substrate configured to electrically connect the gate driving circuit and the first power supply signal line that are adjacent and provide the first power supply voltage to the gate driving circuit; at least one of the plurality of fifth connection bridges connecting adjacent light emitting signal driving circuit circuit blocks comprises a second connection wire on the fifth flexible substrate configured to electrically connect two adjacent light emitting signal driving circuits; at least one of the plurality of fifth connection bridges connecting adjacent scanning signal driving circuit circuit blocks comprises a third connection wire on the fifth flexible substrate configured to electrically connect two adjacent scanning signal driving circuits; at least one of the plurality of fifth connection bridges connecting the light emitting signal driving circuit circuit block and the scanning signal driving circuit circuit block that are adjacent comprises a fourth connection wire on the fifth flexible substrate configured to electrically connect the light emitting signal driving circuit and the scanning signal driving circuit that are adjacent and provide a light emitting signal to the scanning signal driving circuit; and at least one of the plurality of fifth connection bridges connecting adjacent third island-shaped circuit blocks comprises a fifth connection wire on the fifth flexible substrate configured to electrically connect two second power supply signal lines of adjacent third island-shaped circuit blocks.

In some embodiments of the present disclosure, the circuit area comprises a plurality of island-shaped circuit blocks, the plurality of island-shaped circuit blocks comprise a first island-shaped circuit block provided with a gate driving circuit, a second island-shaped circuit block configured to provide a first power supply voltage, and a third island-shaped circuit block configured to provide a second power supply voltage, the second island-shaped circuit block comprises a first power supply signal line on the second island-shaped flexible substrate, the third island-shaped circuit block comprises a second power supply signal line on the third island-shaped flexible substrate, at least one of the plurality of fourth connection bridges connecting the third island-shaped circuit block and one of the plurality island-shaped display blocks that is adjacent to the third island-shaped circuit block comprises a first connection wire on the fourth flexible substrate configured to connect the second power supply signal line and the pixel driving circuit and provide the second power supply voltage to the pixel driving circuit; at least one of the plurality of fourth connection bridges connecting the second island-shaped circuit block and one of the plurality of island-shaped display blocks that is adjacent to the second island-shaped circuit block comprises a second connection wire on the fourth flexible substrate configured to connect the first power supply signal line and the pixel driving circuit and provide the first power supply voltage to the pixel driving circuit; and at least one of the plurality of fourth connection bridges connecting the first island-shaped circuit block and one of the plurality of island-shaped display blocks that is adjacent to the first island-shaped circuit block comprises a third connection wire on the fourth flexible substrate configured to connect the gate driving circuit and the pixel driving circuit and provide a driving signal to the pixel driving circuit.

In some embodiments of the present disclosure, the array substrate further comprises a stretchable support base on a side of the first island-shaped flexible substrate facing away from the dielectric layer.

In some embodiments of the present disclosure, the support base is made of PDMS.

According to another aspect of the present disclosure, there is provided a stretchable display device comprising any of the array substrates as described above.

According to yet another aspect of the present disclosure, there is provided a method for manufacturing an array substrate, comprising: forming a flexible substrate layer on a rigid substrate; forming a display area, a circuit area, and a protection area over the flexible substrate layer and performing a patterning process on the flexible substrate layer, the display area, the circuit area, and the protection area, so that the circuit area is configured to provide an electrical signal to the display area, the protection area comprises a plurality of island-shaped protection blocks, a plurality of first connection bridges and a plurality of second connection bridges, wherein each of the plurality of first connection bridges is configured to connect two adjacent island-shaped protection blocks of the plurality of island-shaped protection blocks, and the plurality of second connection bridges are configured to connect the protection area and the circuit area, and wherein the plurality of first connection bridges comprise a first flexible substrate, and the plurality of second connection bridges comprise a second flexible substrate; and peeling off the rigid substrate.

In some embodiments of the present disclosure, the forming a display area, a circuit area, and a protection area over the flexible substrate layer and performing a patterning process on the flexible substrate layer, the display area, the circuit area, and the protection area further comprises: forming a buffer layer, an active layer, a gate insulating layer, a gate, an interlayer insulating layer, and a source-drain electrode on the flexible substrate layer to form a first stack; and etching the formed first stack through a patterning process to form a first hollow area exposing the flexible substrate layer.

In some embodiments of the present disclosure, the forming a display area, a circuit area, and a protection area over the flexible substrate layer and performing a patterning process on the flexible substrate layer, the display area, the circuit area, and the protection area further comprises: forming a planarization layer to cover the source-drain electrode, the exposed interlayer insulating layer, and the exposed flexible substrate layer; forming an anode electrically connected to the source-drain electrode and a pixel defining layer of a light-emitting pixel on the planarization layer; forming a hard mask material layer covering the anode and the pixel defining layer of the light-emitting pixel and the exposed planarization layer to form a second stack; etching the formed second stack through a patterning process to form a second hollow area exposing the rigid substrate; and etching an area above the anode of the light-emitting pixel to expose the anode, and forming a light emitting layer and a cathode of the light-emitting pixel on the anode.

In some embodiments of the present disclosure, the forming a display area, a circuit area, and a protection area over the flexible substrate layer and performing a patterning process on the flexible substrate layer, the display area, the circuit area, and the protection area further comprises: forming a thin film encapsulation layer.

In some embodiments of the present disclosure, the method further comprises: after peeling off the rigid substrate, attaching a stretchable support base on a side of the flexible substrate layer close to the rigid substrate.

In some embodiments of the present disclosure, the display area comprises OLED display blocks.

BRIEF DESCRIPTION OF THE DRAWINGS

The specific embodiments of the present disclosure will be further described in detail below with reference to the accompanying drawings.

FIG. 1b is a partial schematic view of the array substrate of FIG. 1a;

FIG. 1c is a cross-sectional view of a first connection bridge and a second connection bridge in an array substrate according to an embodiment of the present disclosure, taken along an A-B direction in FIG. 1a;

FIG. 4f and FIG. 4g respectively show partial structural schematic views of the array substrate of FIG. 4a;

Figure 1A:
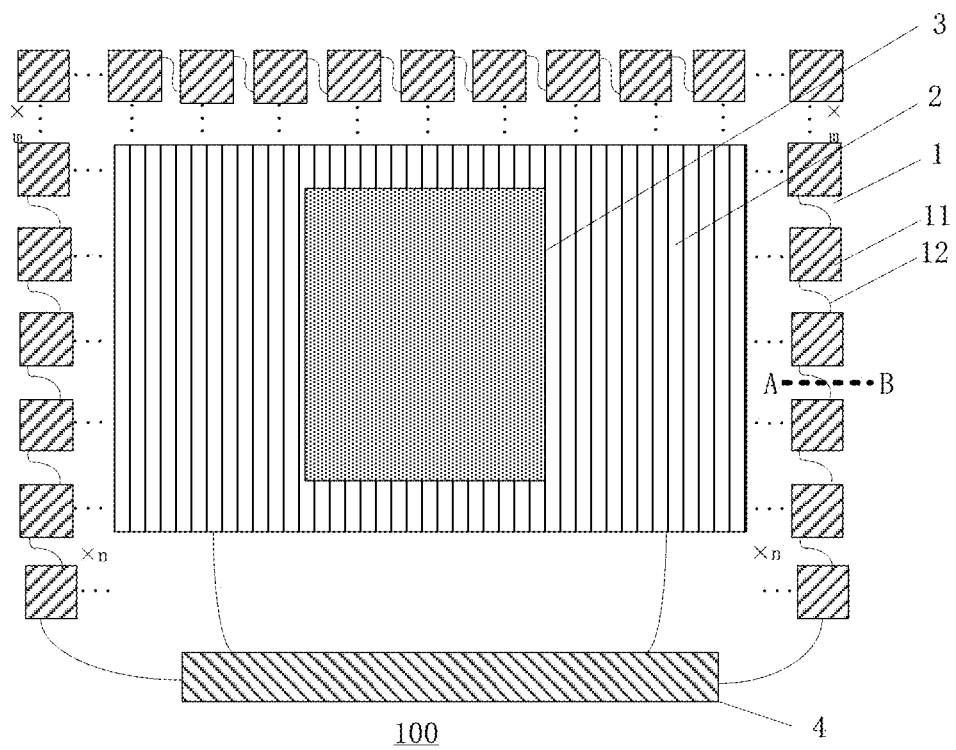
FIG. 1a is a schematic structural diagram of an array substrate according to an embodiment of the present disclosure.

It should be understood that the drawings are only for illustrative description of the embodiments of the present disclosure, and they are not necessarily drawn to scale.

DETAILED DESCRIPTION OF EMBODIMENTS

In order to explain the present disclosure more clearly, the present disclosure is further described below with reference to the embodiments and the accompanying drawings. Similar parts in the drawings are indicated by the same reference numerals. Those skilled in the art should understand that what is specifically described below is illustrative and not restrictive, which should not limit the scope of protection of the present disclosure.

In the related art, a stretchable display device generally has a display area that undergoes deformation, and the periphery of the display device is fixed. When the display device undergoes stretch deformation, the middle area of the display screen is jacked up. However, when the amount of stretch of the jacking is large, the four corner positions of the display device will undergo greater deformation. Once the stretching limit is exceeded, the four corner positions of the display area are easily damaged.

Figure 1B:
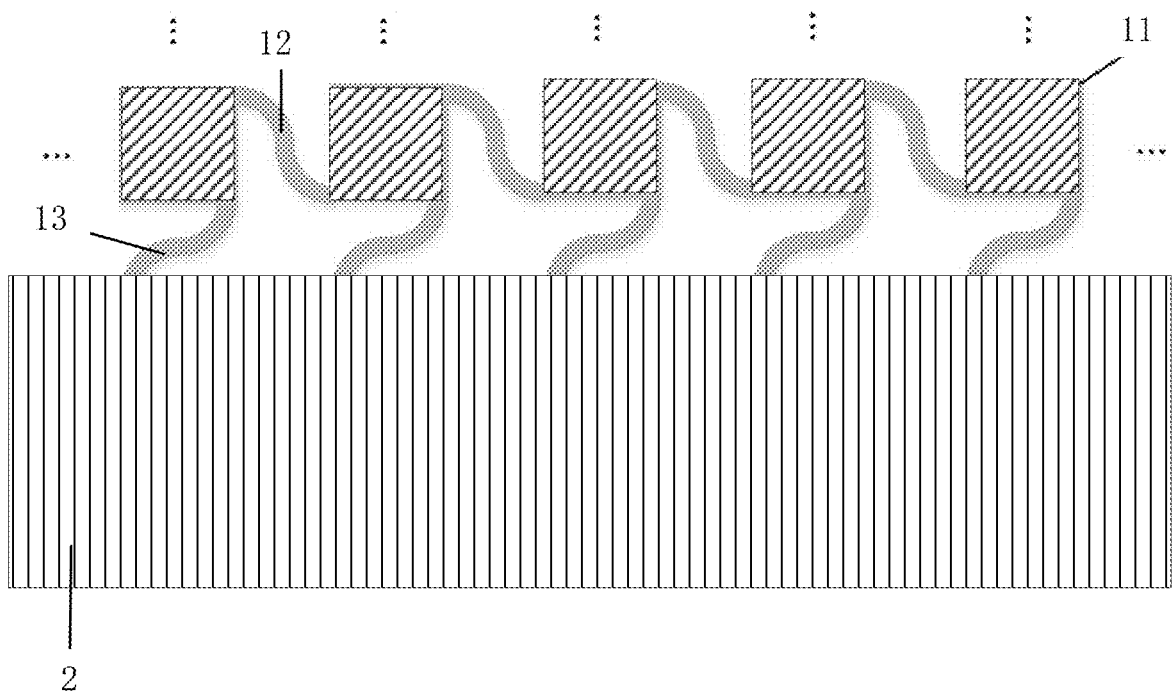
Figure 1C:
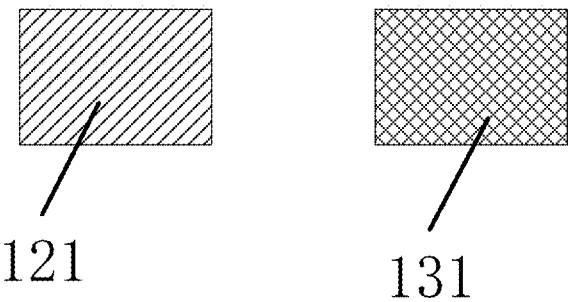

As shown in FIG. 1a to FIG. 1c, an embodiment of the present disclosure provides an array substrate 100 including a display area 3; a circuit area 2 configured to provide an electrical signal to the display area; and a protection area 1 including a plurality of island-shaped protection blocks 11, a plurality of first connection bridges 12, and a plurality of second connection bridges 13, wherein each of the plurality of first connection bridges 12 is configured to connect two adjacent island-shaped protection blocks 11 and the plurality of second connection bridges 13 are configured to connect the protection area 1 and the circuit area 2, and wherein the plurality of first connection bridges include a first flexible substrate 121 and the plurality of second connection bridges include a second flexible substrate 131.

In a specific example, as shown in FIG. 1a to FIG. 1c, the array substrate includes the display area 3, the circuit area 2 surrounding the display area, and the protection area 1 surrounding the circuit area. The protection area 1 includes the island-shaped protection blocks 11 arranged in an array with m rows and n columns, the first connection bridge 12 and the second connection bridge 13. A hollow area is formed among the island-shaped protection block 11, the first connection bridge 12 and the second connection bridge 13. Adjacent island-shaped protection blocks are connected through the first connection bridge 12, and the island-shaped protection blocks 11 are connected with the circuit area through the second connection bridges 13. In some embodiments, n is a positive integer, which is greater than or equal to 1 and less than or equal to 50; and m is a positive integer, which is greater than or equal to 1 and less than or equal to 50. When stretch deformation occurs, the island-shaped protection blocks 11 firstly undergo deformation and release part of the pressure generated by the deformation through the first connection bridges 12 and the second connection bridges 13, which effectively improves the stretch resistance of the edge portion of the array substrate, and thereby improves the overall stretch resistance of the array substrate.

Figure 2:
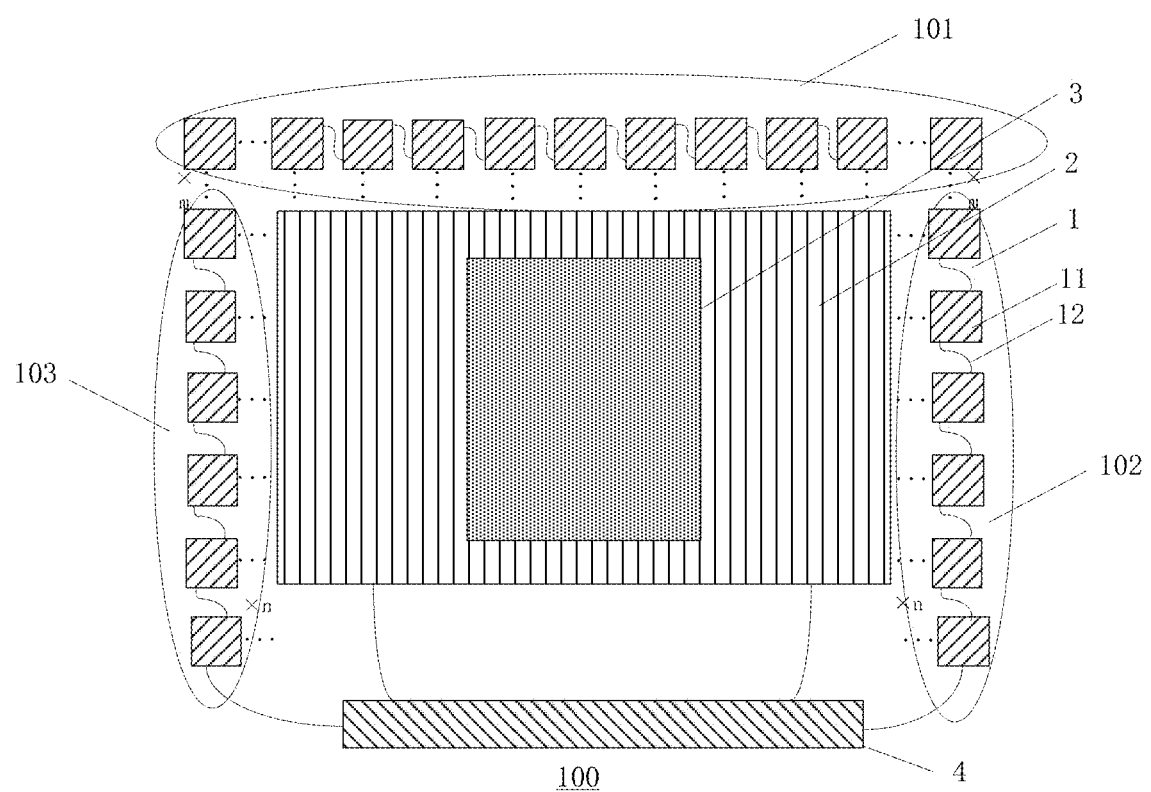
FIG. 2 is a schematic structural diagram of an array substrate according to an embodiment of the present disclosure.

Considering that a large number of signal lines are provided between the display area and the circuit area of the array substrate and a driver IC, in an optional embodiment, as shown in FIG. 2, the array substrate includes a driver IC 4, and the protection area includes a first protection area 101, a second protection area 102, and a third protection area 103. The first protection area 101 is disposed in a first direction relative to the driver IC 4, and the second protection area 102 and the third protection area 103 are disposed in a second direction relative to the driver IC 4. The first direction and the second direction are perpendicular to each other.

Specifically, as shown in FIG. 2, the first direction is perpendicular to the second direction, the first protection area is located at a side of the display area away from the driver IC 4, and the second protection area and the third protection area are respectively located at two sides of the display area in a second direction perpendicular to the driver IC. The first protection area, the second protection area, and the third protection area can improve the stretch resistance of the edge position of the display substrate, and at the same time ensure the normal connection of the signal lines between the display area and the circuit area with the driver IC.

Figure 3A:
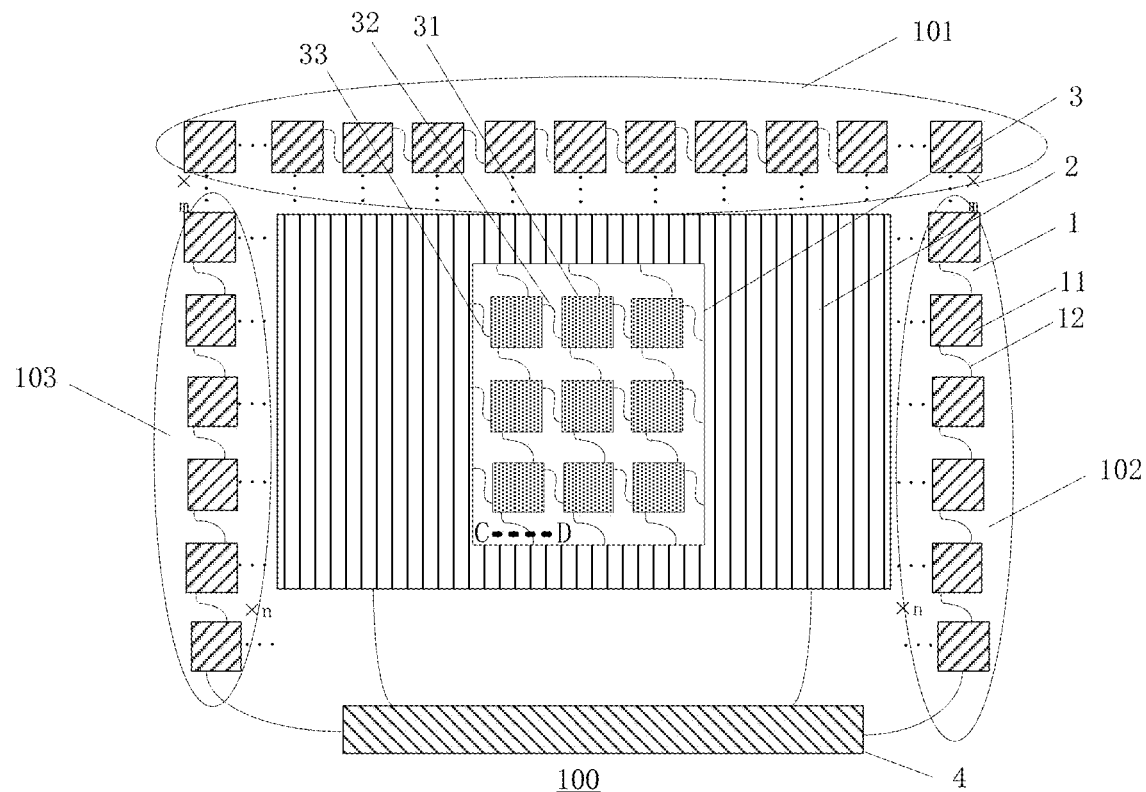
FIG. 3a is a schematic structural diagram of an array substrate according to an embodiment of the present disclosure.
Figure 3B:
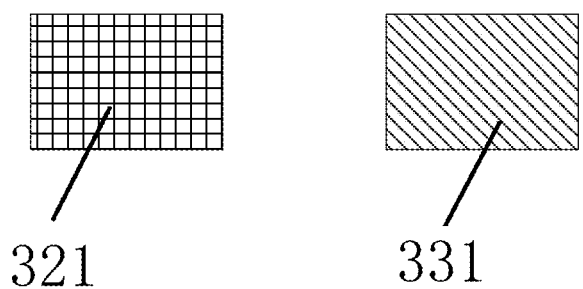
FIG. 3b is a cross-sectional view of a third connection bridge and a fourth connection bridge in the array substrate of FIG. 3a, taken along a C-D direction.

In an optional embodiment, as shown in FIG. 3a to FIG. 3b, the display area 3 includes a plurality of island-shaped display blocks 31 arranged in an array, third connection bridges 32 and fourth connection bridges 33. The third connection bridges 32 and the fourth connection bridges 33 include a third flexible substrate 321 and a fourth flexible substrate 331, respectively. Each island-shaped display block 31 is provided with at least one display block, each third connection bridge 32 is configured to connect two adjacent island-shaped display blocks 31, and the fourth connection bridge 33 is configured to connect the display area 3 and the circuit area 2. A hollow area is formed among the island-shaped display block 31, the third connection bridge 32 and the fourth connection bridge 33. The third connection bridges 32 and the fourth connection bridges 33 are not only used to connect adjacent island-shaped display blocks or used to connect the display area and the circuit area, but also used to transmit electrical signals for controlling display in the display area, such as control signals, display signals, and power supply voltage signals for operating the light-emitting pixels in the display area through connection wires provided in the third connection bridges 32 and the fourth connection bridges 33. When stretch deformation occurs, the island-shaped display block 31 undergoes deformation and releases part of the pressure caused by the deformation through the third connection bridges 32, the fourth connection bridges 33, the first connection bridges 12 and the second connection bridges 13, thereby improving the stretch resistance of the display area and further improving the display effect and user experience of the display device.

Figure 4A:
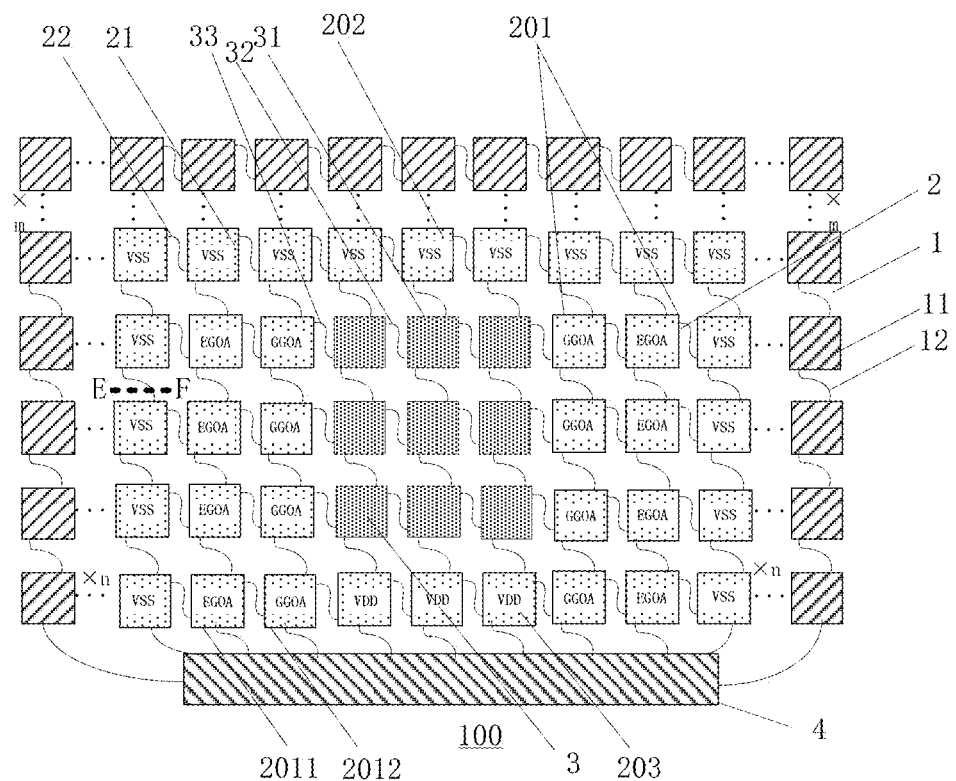
FIG. 4a is a schematic structural diagram of an array substrate according to an embodiment of the present disclosure.
Figure 4B:
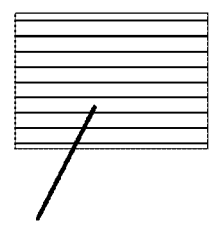
FIG. 4b is a cross-sectional view of a fifth connection bridge in the array substrate of FIG. 4a, taken along an E-F direction.

In an alternative embodiment, as shown in FIG. 4a to FIG. 4b, the circuit area 2 includes a plurality of island-shaped circuit blocks 21 arranged in an array and fifth connection bridges 22 for connecting adjacent island-shaped circuit blocks. The island-shaped circuit block 21 includes a first island-shaped circuit block 201 provided with a gate driving circuit, a second island-shaped circuit block 202 provided with a first power supply voltage, and a third island-shaped circuit block 203 provided with a second power supply voltage. A hollow area is formed among the first island-shaped circuit block 201, the second island-shaped circuit block 202, the third island-shaped circuit block 203, and the fifth connection bridge 22. In some embodiments, the fifth connection bridge 22 may include a fifth flexible substrate 221.

It should be understood that the first connection bridge, the second connection bridge, the third connection bridge, the fourth connection bridge, and the fifth connection bridge may include the same flexible substrate, that is, the first flexible substrate 121, the second flexible substrate 131, the third flexible substrate 321, the fourth flexible substrate 331, and the fifth flexible substrate 221 may be made of the same material, for example, made of polyimide. In some embodiments, any one or more of the first flexible substrate, the second flexible substrate, the third flexible substrate, the fourth flexible substrate, and the fifth flexible substrate may include other flexible materials, such as other organic materials and the like, which is not limited in this disclosure.

In some embodiments, the first island-shaped circuit block 201 is provided with the gate driving circuit, the second island-shaped circuit block 202 is configured to provide a first power supply voltage (e.g., VSS) to the island-shaped display block, and the third island-shaped circuit block 203 is configured to provide a second power supply voltage (e.g., VDD) to the island-shaped display block. The fifth connection bridges 22 are not only used to connect adjacent island-shaped circuit blocks, but also used to transmit electrical signals for controlling display in the display area, such as control signals, display signals, and power supply voltage signals for operating the light-emitting pixels in the display area through connection wires provided in the fifth connection bridges 22. When stretch deformation occurs, the first island-shaped circuit blocks 201, the second island-shaped circuit blocks 202, and the third island-shaped circuit blocks 203 undergo deformation and release part of the pressure generated by the deformation through the first connection bridges 12, the second connection bridges 13, the third connection bridges 32, the fourth connection bridges 33 and the fifth connection bridges 22. That is, the circuit area 2 is arranged as island-shaped structures and bridge structures arranged in an array to further withstand external stretch deformation, and the island-shaped structures such as the island-shaped display blocks, the island-shaped circuit blocks and the island-shaped protection blocks, and bridge structures such as the first connection bridges, the second connection bridges, the third connection bridges, the fourth connection bridges, and the fifth connection bridges form overall island-shaped structures and bridge structures arranged in the array, thereby effectively improving the stretch resistance of the array substrate.

Considering the structural characteristics of the gate driving circuit such as integrated configuration, in an optional embodiment, as shown in FIG. 4a, the gate driving circuit includes a light emitting signal driving circuit (EGOA, EM-GOA) and a scanning signal driving circuit (GGOA, Gate-GOA). The first island-shaped circuit blocks are respectively provided with an EGOA or a GGOA. Specifically, the first island-shaped circuit block 201 provided with the gate driving circuit may be divided into an EGOA circuit block 2011 provided with the EGOA and a GGOA circuit block 2012 provided with the GGOA. The EGOA is used to control the light emission of the light-emitting pixels of the electroluminescent diode, and the GGOA is used to control the gate signal of the gate. It should be understood that the present disclosure does not limit the positional relationship between the EGOA circuit block 2011 and the GGOA circuit block 2012, and the positions of the two in the circuit can be used interchangeably. The divided EGOA circuit blocks 2011 and GGOA circuit blocks 2012 can better set the gate driving circuit on different island-shaped circuit blocks, and effectively improve the stretch resistance of the array substrate while ensuring the stable transmission of the signal lines of the array substrate.

Figure 4C:
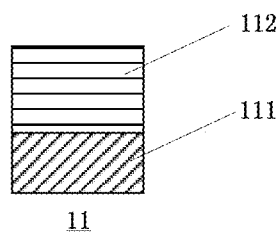
FIG. 4c is a schematic cross-sectional view of an island-shaped protection block according to an embodiment of the present disclosure, taken along a direction perpendicular to a plane where a first flexible substrate is located.
Figure 4D:
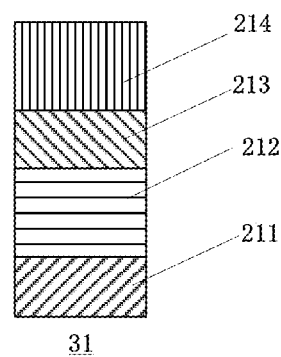
FIG. 4d is a schematic cross-sectional view of an island-shaped display block according to an embodiment of the present disclosure, taken along a direction perpendicular to a plane where the first flexible substrate is located.
Figure 4E:
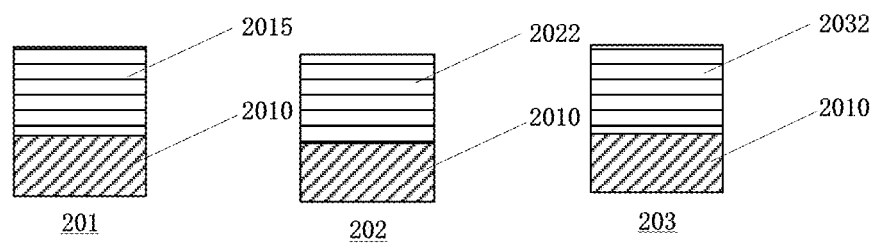
FIG. 4e shows schematic cross-sectional views of a first island-shaped circuit block, a second island-shaped circuit block, and a third island-shaped circuit block according to an embodiment of the present disclosure, taken along a direction perpendicular to a plane where the first flexible substrate is located.

FIG. 4c is a schematic cross-sectional view of an island-shaped protection block 11 according to an embodiment of the present disclosure, taken along a direction perpendicular to a plane where the first flexible substrate is located. FIG. 4d is a schematic cross-sectional view of an island-shaped display block 31 according to an embodiment of the present disclosure, taken along a direction perpendicular to a plane where the first flexible substrate is located. FIG. 4e shows schematic cross-sectional views of a first island-shaped circuit block 201, a second island-shaped circuit block 202, and a third island-shaped circuit block 203 according to an embodiment of the present disclosure, taken along a direction perpendicular to a plane where the first flexible substrate is located. In one embodiment, as shown in FIG. 4c to FIG. 4e, the island-shaped protection block 11 may include a first island-shaped flexible substrate 111. Optionally, the island-shaped protection block 11 may further include a dielectric layer 112 on the first island-shaped flexible substrate 111. The island-shaped display block 31 may include a second island-shaped flexible substrate 211, a pixel driving circuit 212 such as one or more first thin film transistors, and a light-emitting pixel 213 formed on the second island-shaped flexible substrate 211. The light-emitting pixel 213 is driven to emit light by the pixel driving circuit and is configured to emit light in response to an electrical signal received from the pixel driving circuit. Optionally, the island-shaped display block may further include an encapsulation layer 214 on the light-emitting pixel 213. The first island-shaped circuit block 201 may include a third island-shaped flexible substrate 2010, and a gate driving circuit 2015 formed on the third island-shaped flexible substrate 2010, such as one or more second thin film transistors. The second island-shaped circuit block 202 may include the third island-shaped flexible substrate 2010, and a first power supply signal line 2022 formed on the third island-shaped flexible substrate 2010 to provide a first power supply voltage for the light-emitting pixel. The third island-shaped circuit block 203 may include the third island-shaped flexible substrate 2010, and a second power supply signal line 2032 formed on the third island-shaped flexible substrate 2010 to provide a second power supply voltage for the light-emitting pixel. It should be understood that the island-shaped protection block, island-shaped display block, and island-shaped circuit block may include the same island-shaped flexible substrate, that is, the first island-shaped flexible substrate 111, the second island-shaped flexible substrate 211, and the third island-shaped flexible substrate 2010 may be made of the same material, such as polyimide. In some embodiments, any one or more of the first island-shaped flexible substrate, the second island-shaped flexible substrate, and the third island-shaped flexible substrate may include other flexible materials, such as other organic materials and the like, which is not limited by the present disclosure.

In some embodiments, the first connection bridge and the second connection bridge may also include a dielectric layer 112 formed on the first flexible substrate or the second flexible substrate. The third connection bridge and the fourth connection bridge may also include a dielectric layer 112 formed on the third flexible substrate or the fourth flexible substrate. The third connection bridge may also include a first conductive layer formed in the dielectric layer electrically connecting adjacent island-shaped display blocks. The fourth connection bridge may also include a second conductive layer formed in the dielectric layer electrically connecting the island-shaped display block and the island-shaped circuit block that are adjacent. The fifth connection bridge may also include a dielectric layer, a third conductive layer formed in the dielectric layer electrically connecting adjacent island-shaped circuit blocks, and the like.

Figure 4F:
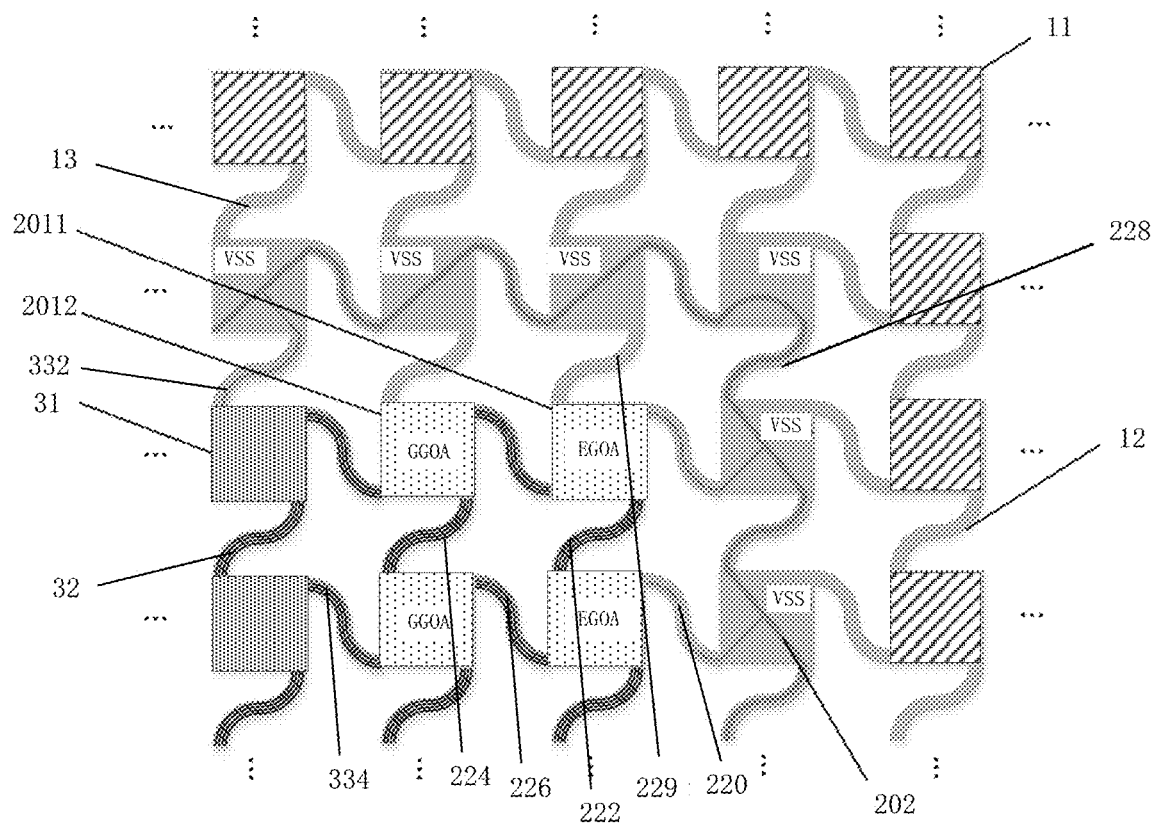
Figure 4G:
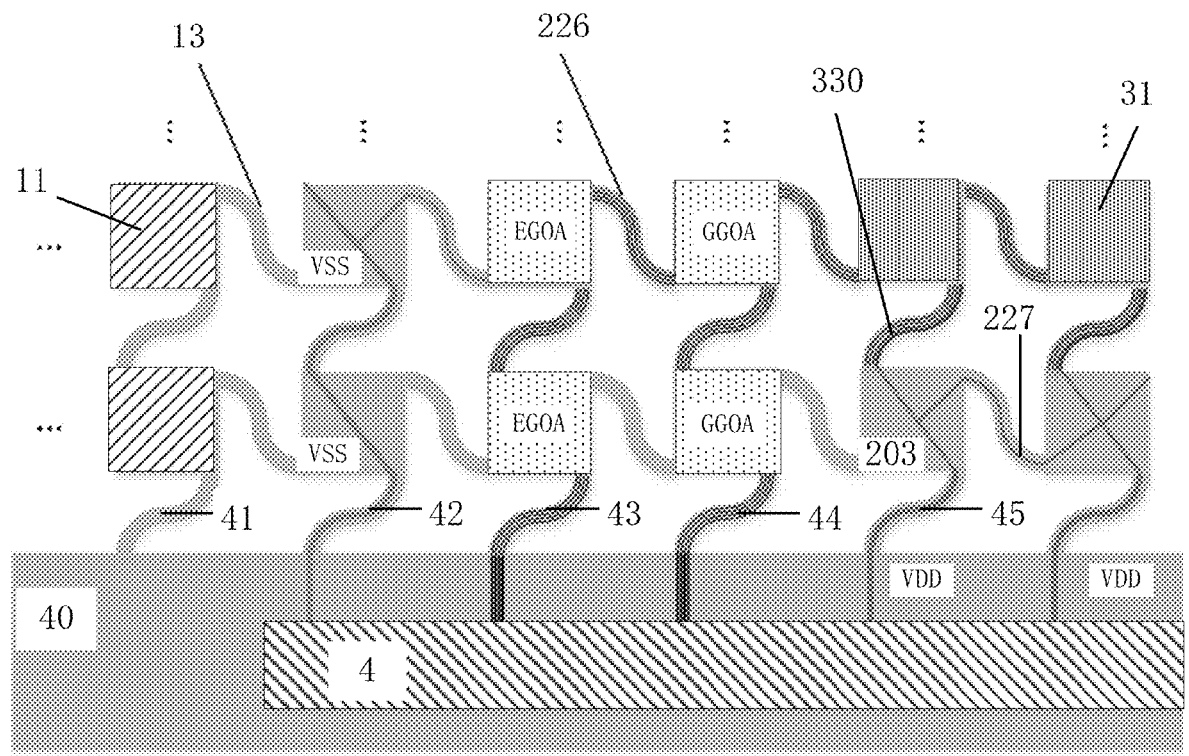

In some embodiments, as shown in FIG. 4f and FIG. 4g, the fifth connection bridges may include: at least one fifth connection bridge connecting the first island-shaped circuit block (e.g., EGOA circuit block 2011) and the second island-shaped circuit block 202 (e.g., VSS) that are adjacent, which includes a first connection wire 220 on the fifth flexible substrate configured to electrically connect the gate driving circuit and the first power supply signal line that are adjacent and provide the first power supply voltage (e.g., VSS) to the gate driving circuit; at least one fifth connection bridge connecting adjacent light emitting signal driving circuit circuit blocks (e.g., EGOA circuit blocks 2011), which includes a second connection wire 222 on the fifth flexible substrate configured to electrically connect two adjacent light emitting signal driving circuits; at least one fifth connection bridge connecting adjacent scanning signal driving circuit circuit blocks (e.g., GGOA circuit blocks 2012), which includes a third connection wire 224 on the fifth flexible substrate configured to electrically connect two adjacent scanning signal driving circuits; and at least one fifth connection bridge connecting the light emitting signal driving circuit circuit block and the scanning signal driving circuit circuit block (e.g., the EGOA circuit block 2011 and the GGOA circuit block 2012) that are adjacent, which includes a fourth connection wire 226 on the fifth flexible substrate configured to electrically connect the light emitting signal driving circuit and the scanning signal driving circuit that are adjacent and provide a light emitting signal and an optional first power supply voltage (e.g., VSS) to the GGOA circuit block 2012. In some embodiments, the fifth connection bridge may further include at least one fifth connection bridge connecting adjacent third island-shaped circuit blocks, which includes a fifth connection wire 227 on the fifth flexible substrate configured to electrically connect two second power supply signal lines of adjacent third island-shaped circuit blocks. In some embodiments, the fifth connection bridge may further include at least one fifth connection bridge between two adjacent second island-shaped circuit blocks 202 (e.g., VSS), which includes a second island-shaped circuit block connection wire 228 electrically connecting two adjacent first power supply signal lines. In some embodiments, the fifth connection bridges may further include at least one connection bridge 229 between the second island-shaped circuit block 202 (e.g., VSS) and the first island-shaped circuit block (e.g., EGOA circuit block 2011), which does not provide an electrical connection. In some embodiments, the fourth connection bridges may include at least one fourth connection bridge connecting the third island-shaped circuit block and the island-shaped display block (e.g., the third island-shaped circuit block 203 and the island-shaped display block 31) that are adjacent, which includes a first connection wire 330 on the fourth flexible substrate configured to connect the second power supply signal line and the pixel driving circuit and provide a second power supply voltage (such as VDD) to the pixel driving circuit; at least one fourth connection bridge connecting the second island-shaped circuit block and the island-shaped display block (e.g., the second island-shaped circuit block 202 and the island-shaped display block 31) that are adjacent, which includes a second connection wire 332 on the fourth flexible substrate configured to connect the first power supply signal line and the pixel driving circuit and provide a first power supply voltage (such as VSS) to the pixel driving circuit; and at least one fourth connection bridge connecting the first island-shaped circuit block and the island-shaped display block (e.g., the GGOA circuit block 2012 and the island-shaped display block 31) that are adjacent, which includes a third connection wire 334 on the fourth flexible substrate configured to connect the gate driving circuit and the pixel driving circuit and provide a driving signal and an optional first power supply voltage to the pixel driving circuit. It should be understood that a data line or the like (not shown) is also connected between the driver IC 4 and the island-shaped display block 31, and the data line can be connected to the island-shaped display block 31 through the third island-shaped circuit block 203, for example, which is not repeated here. In some embodiments, as shown in FIG. 4f and FIG. 4g, the first power supply voltage, such as VSS, can be connected to the display area from different directions, so that the voltage drop during the conduction in the display area can be reduced, and the display of the display area is thus more uniform.

In addition, in some embodiments, as shown in FIG. 4 g, the driver IC 4 may be disposed on the IC substrate 40. In some embodiments, the IC substrate 40 may be formed of the same material as the island-shaped protection block 11. In some embodiments, the IC substrate 40 may be formed in the same patterning process as the island-shaped protection block 11. In some embodiments, the driver IC 4 may be attached to the IC substrate 40 through a bonding process. In some embodiments, the island-shaped protection block 11, the second island-shaped circuit block, the EGOA circuit block, the GGOA circuit block, and the third island-shaped circuit block 203 may be connected to the driver IC 4 through the connection bridges 41, 42, 43, 44, 45 respectively. The connection bridges 42, 43, 44, and 45 may be provided with connection wires for providing electrical connections between the second island-shaped circuit block, the EGOA circuit block, the GGOA circuit block, and the third island-shaped circuit block 203 with the driver IC 4. The specific structures of the connection bridges 41, 42, 43, 44, 45 can refer to the structure of any one of the first connection bridge, the second connection bridge, the third connection bridge, the fourth connection bridge, and the fifth connection bridge. This is not limited in the present disclosure, as long as the stretch resistant function and the electrical connection function can be realized.

Figure 5:
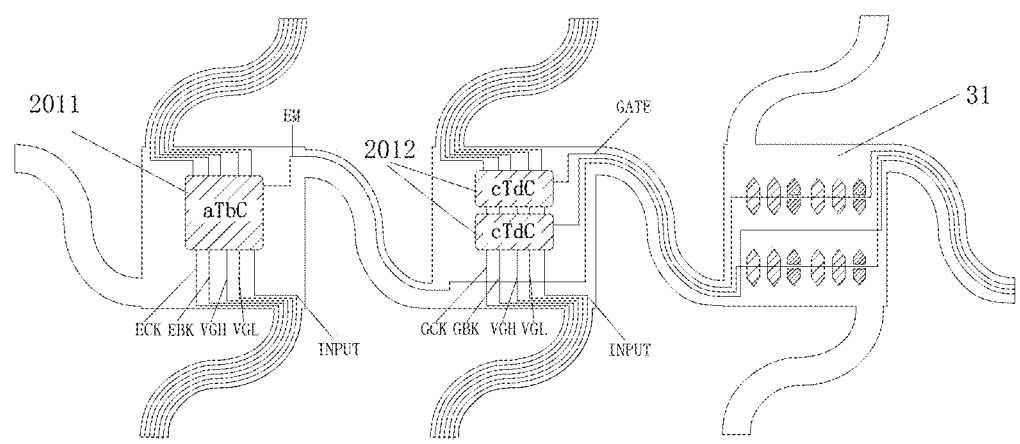
FIG. 5 is a schematic structural diagram of first island-shaped circuit blocks and an island-shaped display block according to an embodiment of the present disclosure.

In a specific example, FIG. 5 shows the EGOA circuit block 2011, the GGOA circuit block 2012, and the island-shaped display block 31 in the array substrate. The EGOA circuit block 2011 and the GGOA circuit block 2012 are connected through the fifth connection bridge. The GGOA circuit block 2012 and the island-shaped display block 31 are connected through the fourth connection bridge. Specifically, the EGOA circuit block 2011 is provided with the EGOA, including a TFTs and b capacitors, for example, including 10 TFTs and 3 capacitors. The input signals during the operation of the EGOA include ECK signals, EBK signals, VGH signals, VGL signals and Input signals. The EGOA outputs EM signals, each EM signal is used to control two rows of light-emitting pixels. The GGOA circuit block 2012 is provided with the GGOA, including c TFTs and d capacitors, for example, including 8 TFTs and 2 capacitors. The input signals during the operation of the GGOA include GCK signals, GBK signals, VGH signals, VGL signals, and Input signals. The GGOA outputs the Gate signal, and each Gate signal controls a row of light-emitting pixels. It should be understood that there may also be many other connection wires among the EGOA circuit block 2011, the GGOA circuit block 2012 and the island-shaped display block 31 shown in FIG. 5. For example, a data line (not shown) and the like may also be connected between adjacent island-shaped display blocks 31. Further, there may be the connection wire (not shown in FIG. 5) for transmitting the first power supply voltage between the EGOA circuit block 2011 and GGOA circuit block 2012 that are adjacent as described above, which is not repeated here.

In some embodiments, a plurality of GGOAs form a gate control array, and a plurality of EGOAs form a light-emitting control array. The data lines from the driver IC and the connection wires from the GGOA and EGOA transmit data signals and drive signals to the island-shaped display blocks. The smallest light-emitting unit (such as a light-emitting pixel) in each island-shaped display block emits light in response to the data signal and the driving signal. For example, the pixel driving circuit of each light-emitting pixel may include a 7T1C driving circuit. The light-emitting pixels can be scanned line by line by the driving signals, and different driving signals can be applied at different times to control the on and off of the TFTs to realize the charging and discharging of capacitors and the light emission of the light-emitting pixels, thereby lighting the display panel to achieve the display. For specific display processes and display principles, please refer to related technologies in the art, which will not be repeated here in this disclosure.

In order to enable the array substrate to withstand the stretch deformation uniformly to the maximum extent, in an optional embodiment, the sizes of the island-shaped protection blocks, the island-shaped circuit blocks and the island-shaped display blocks are the same. Further, in another optional embodiment, the sizes of the first connection bridges, the second connection bridges, the third connection bridges, the fourth connection bridges, and the fifth connection bridges are the same. Island-shaped structures of the same sizes and bridge structures of the same sizes arranged in an array are formed in the array substrate, which effectively improves the stretch resistance of the array substrate.

Figure 6:
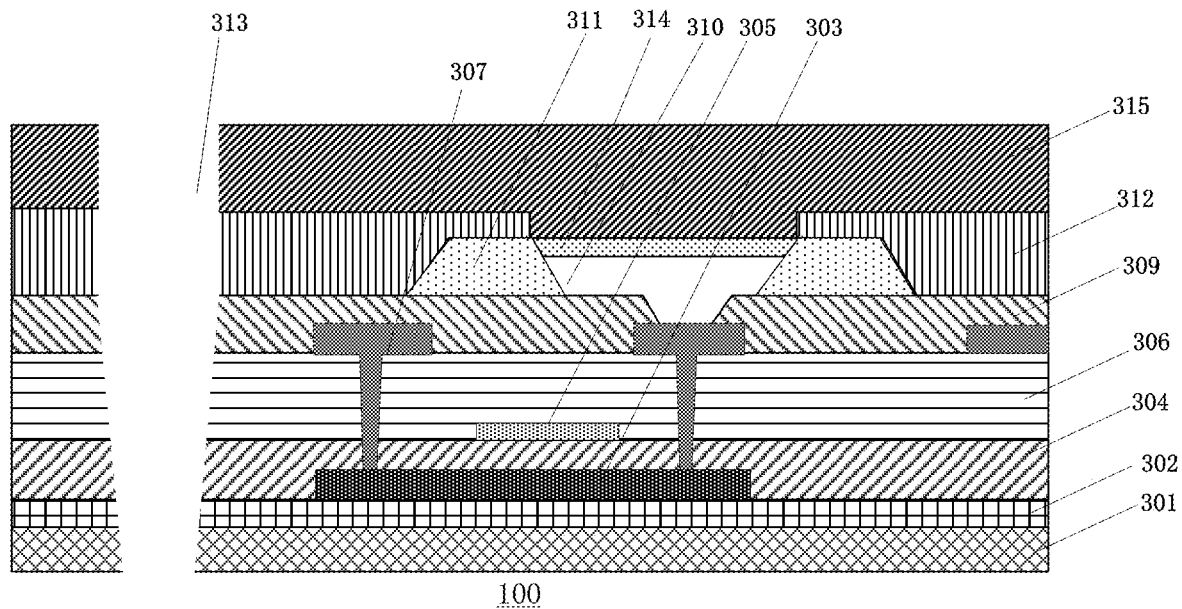
FIG. 6 is a schematic cross-sectional view of an array substrate according to an embodiment of the present disclosure, taken along a direction perpendicular to a plane where the first flexible substrate is located.

In one embodiment, as shown in FIG. 6, the array substrate 100 includes a dielectric layer formed on the flexible substrate layer 301, and the dielectric layer includes a buffer layer 302, a gate insulating layer 304, an interlayer insulating layer 306 and a planarization layer 309 on the flexible substrate layer 301. A first thin film transistor and a second thin film transistor include an active layer 303 on the flexible substrate layer 301, a gate 305 on the gate insulating layer 304, and a source-drain electrode 307 on the interlayer insulating layer 306. An encapsulation layer includes a hard mask layer 312 and a thin film encapsulation layer 315 that cover the planarization layer 309, the first thin film transistor, and the second thin film transistor. The light-emitting pixel includes an Organic Light Emitting Diode (OLED), which includes an anode 310 on the planarization layer, a pixel defining layer 311 surrounding the anode 310, and a light emitting layer and a cathode 314 on the anode. The first power supply signal line, the second power supply signal line, the first conductive layer, the second conductive layer, the third conductive layer, and the source-drain electrodes of the first thin film transistor and the second thin film transistor may be disposed in the same layer. It is worth noting that those skilled in the art should understand that FIG. 6 is a cross-sectional view of the island-shaped display block area of the display area of the array substrate and its surrounding structure, which is only used to explain the specific structure of the array substrate, and the rest is not shown. The flexible substrate layer may be any one of the first flexible substrate, the second flexible substrate, the third flexible substrate, the fourth flexible substrate, the fifth flexible substrate, the first island-shaped flexible substrate, the second island-shaped flexible substrate and the third island-shaped flexible substrate described above, or other suitable flexible substrates.

In some embodiments, the island-shaped display block is electrically connected to the adjacent island-shaped display block and the island-shaped circuit block through the third connection bridge or the fourth connection bridge. A hollow area is formed among the island-shaped display block, the third connection bridge and the fourth connection bridge. The display area is subject to and releases the pressure caused by external stretch deformation through the island-shaped display blocks, the third connection bridges, the fourth connection bridges, and the hollow area.

In some embodiments, the first island-shaped circuit block includes the EGOA and GGOA. Electrical signals are transmitted between adjacent island-shaped circuit blocks through the fifth connection bridge, the second island-shaped circuit block can provide the first power supply voltage to the light-emitting pixel through the first power supply signal line and the fourth connection bridge, and the third island-shaped circuit block can provide the second power supply voltage to the light-emitting pixel through the second power supply signal line and the fourth connection bridge. A hollow area is formed between the island-shaped circuit block and the fifth connection bridge. The circuit area is subject to and releases the pressure caused by external stretch deformation through the first island-shaped circuit block, the second island-shaped circuit block, the third island-shaped circuit block, the fifth connection bridge and the hollow area.

It should be understood that, in the embodiments of the present disclosure, the transistor may include a top-gate structure or a bottom-gate structure, which is not limited in the present disclosure. As known to those skilled in the art, in some cases, the source and drain of a transistor may be used interchangeably.

In some embodiments, there is no electrical signal transmission among the island-shaped protection block, the first connection bridge and the second connection bridge. The island-shaped protection block connects the adjacent island-shaped protection block through the first connection bridge. The island-shaped protection block connects the adjacent island-shaped circuit block through the second connection bridge. A hollow area is formed among the island-shaped protection block, the first connection bridge and the second connection bridge. The protection area is subject to and releases the pressure caused by external stretch deformation through the island-shaped protection block, the first connection bridge, the second connection bridge, and the hollow area.

In some embodiments, a structure of the plurality of island-shaped blocks and the plurality of connection bridges of the array substrate is formed through the island-shaped display blocks, the first island-shaped circuit blocks, the second island-shaped circuit blocks, the third island-shaped circuit blocks, the island-shaped protection blocks, the first connection bridges, the second connection bridges, the third connection bridges, the fourth connection bridges, and the fifth connection bridges, which effectively improves the stretch resistance of the array substrate.

Figure 7:
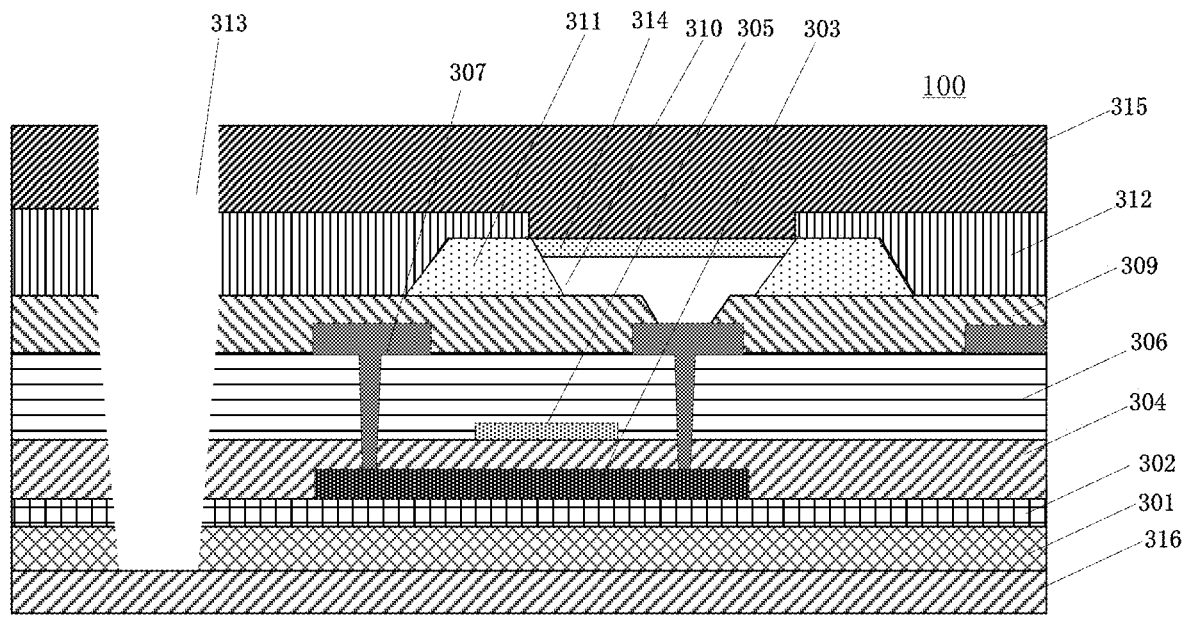
FIG. 7 is a schematic cross-sectional view of an array substrate according to an embodiment of the present disclosure, taken along a direction perpendicular to a plane where the first flexible substrate is located.

Considering the overall structure of the array substrate, in an alternative embodiment, as shown in FIG. 7, the array substrate 100 further includes a stretchable support base 316, which is disposed on a surface of the flexible substrate layer 301 facing away from the buffer layer 302. The stretchable support base 316 may be exposed in the hollow area (e.g., a hollow area 313) among the island-shaped display blocks, island-shaped circuit blocks, island-shaped protection blocks, first connection bridges, second connection bridges, third connection bridges, fourth connection bridges, and fifth connection bridges. That is, in the process of manufacturing the array substrate, a hollow area may be firstly formed among the island-shaped display blocks, island-shaped circuit blocks, island-shaped protection blocks, first connection bridges, second connection bridges, third connection bridges, fourth connection bridges, and fifth connection bridges, to facilitate subsequent production and installation. Then, a layer of stretchable support base may be attached to a surface of the island-shaped display blocks, island-shaped circuit blocks, island-shaped protection blocks, first connection bridges, second connection bridges, third connection bridges, fourth connection bridges and fifth connection bridges together with the hollow area facing away from the buffer layer 302, so that the structure of the plurality of island-shaped blocks and the plurality of connection bridges of the array substrate can be effectively maintained and supported within a certain stretching range.

By way of example, the stretchable support base may be made from an organic material, such as PDMS.

It should be noted that, as explained herein, the terms "island-shaped protection block", "island-shaped display block", and "island-shaped circuit block" should be understood as different entities that do not exist continuously on the same physical plane, for example, island structures formed through the semiconductor patterning process. In some embodiments, as disclosed herein, different entities may be connected by a connection bridge, and there is a hollow area between different entities. In some embodiments, different island-shaped structures may be located on the same continuous support base. An orthographic projection of any one of the island-shaped protection block, the island-shaped display block, and the island-shaped circuit block on the support base may include a rectangle, a circle, a square, or any other suitable shape. Different orthographic projections may include the same shape or different shapes, which is not limited in this disclosure. In addition, different orthographic projections may include the same or different areas, which is not limited in this disclosure.

Figure 8A:
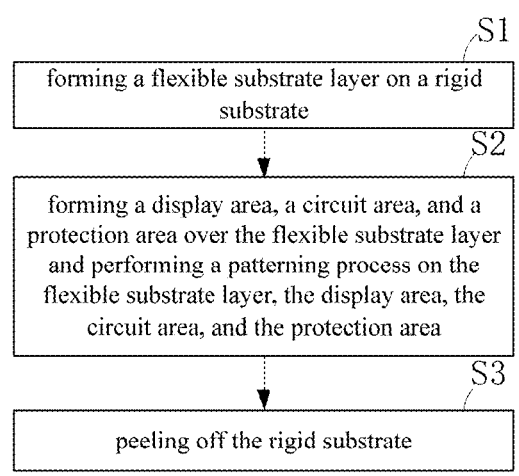
FIG. 8a shows a flowchart of a method for manufacturing an array substrate according to an embodiment of the present disclosure.
Figure 8B:
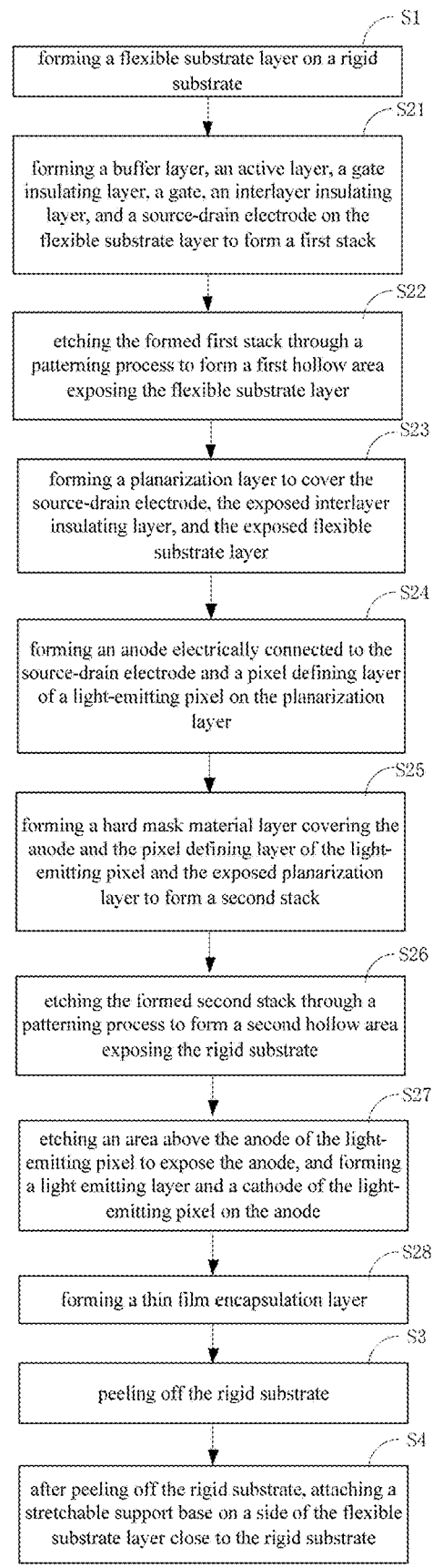
FIG. 8b illustrates a flowchart of a method of manufacturing an array substrate according to an embodiment of the present disclosure.

In some embodiments, corresponding to the array substrate provided in the above embodiments, an embodiment of the present disclosure also provides a method for manufacturing the above array substrate, as shown in FIG. 8a, including: S1, forming a flexible substrate layer on a rigid substrate; S2, forming a display area, a circuit area, and a protection area over the flexible substrate layer and performing a patterning process on the flexible substrate layer, the display area, the circuit area, and the protection area, so that the circuit area is configured to provide an electrical signal to the display area, the protection area includes a plurality of island-shaped protection blocks, a plurality of first connection bridges and a plurality of second connection bridges, wherein each of the plurality of first connection bridges is configured to connect two adjacent island-shaped protection blocks, and the plurality of second connection bridges are configured to connect the protection area and the circuit area, and wherein the plurality of first connection bridges include a first flexible substrate, and the plurality of second connection bridges include a second flexible substrate; and S3, peeling off the rigid substrate.

In an optional embodiment, forming a display area, a circuit area, and a protection area over the flexible substrate layer and performing a patterning process on the flexible substrate layer, the display area, the circuit area, and the protection area further includes: forming the display area including a plurality of island-shaped display blocks, a plurality of third connection bridges, and a plurality of fourth connection bridges, wherein each of the plurality of third connection bridges is configured to connect two adjacent island-shaped display blocks, the plurality of fourth connection bridges are configured to connect the display area and the circuit area, the plurality of third connection bridges include a third flexible substrate, and the plurality of fourth connection bridges include a fourth flexible substrate.

In another optional embodiment, forming a display area, a circuit area, and a protection area over the flexible substrate layer and performing a patterning process on the flexible substrate layer, the display area, the circuit area, and the protection area further includes: forming the circuit area including a plurality of island-shaped circuit blocks and a plurality of fifth connection bridges, wherein each of the plurality of fifth connection bridges is configured to connect two adjacent island-shaped circuit blocks, and the plurality of fifth connection bridges include a fifth flexible substrate.

The flexible substrate layer may be any one of the first flexible substrate, the second flexible substrate, the third flexible substrate, the fourth flexible substrate, the fifth flexible substrate, the first island-shaped flexible substrate, the second island-shaped flexible substrate and the third island-shaped flexible substrate described above, or other suitable flexible substrates.

In some embodiments, the island-shaped circuit block is formed to include a first island-shaped circuit block provided with a gate driving circuit, a second island-shaped circuit block configured to provide a first power supply voltage, and a third island-shaped circuit block configured to provide a second power supply voltage.

In a specific example, as shown in FIG. 8b and FIGS. 9a-9h, the specific steps of the method for manufacturing an array substrate are as follows.

S1: forming a flexible substrate layer on a rigid substrate.

Figure 9A:
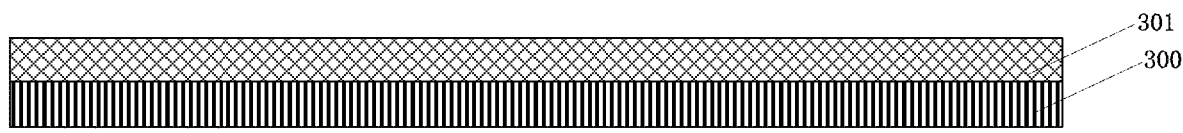
FIGS. 9a-9h are schematic cross-sectional views of different stages of a method of manufacturing an array substrate according to an embodiment of the present disclosure, taken along a direction perpendicular to a plane where the first flexible substrate is located.

In this embodiment, as shown in FIG. 9a, the rigid substrate 300 is glass, and the flexible substrate layer 301 is polyimide. The flexible substrate layer 301 is formed on the rigid substrate 300.

S2: forming a display area, a circuit area, and a protection area over the flexible substrate layer and performing a patterning process on the flexible substrate layer, the display area, the circuit area, and the protection area, so that the circuit area is configured to provide an electrical signal to the display area, the protection area includes a plurality of island-shaped protection blocks, a plurality of first connection bridges and a plurality of second connection bridges, wherein each of the plurality of first connection bridges is configured to connect two adjacent island-shaped protection blocks, and the plurality of second connection bridges are configured to connect the protection area and the circuit area, and wherein the plurality of first connection bridges include a first flexible substrate, and the plurality of second connection bridges include a second flexible substrate.

In this embodiment, as shown in FIGS. 9b-9h, S2 may specifically include the following steps.

S21: forming a buffer layer, an active layer, a gate insulating layer, a gate, an interlayer insulating layer, and a source-drain electrode on the flexible substrate layer to form a first stack;

In some embodiments, a buffer layer 302 is formed on the flexible substrate layer 301. Active layers 303 are respectively formed on the buffer layer 302 corresponding to an area where an island-shaped display block is to be formed and an area where a first island-shaped circuit block is to be formed. A gate insulating layer 304 is formed to cover the active layers 303 and the exposed buffer layer 302. Gates 305 are formed on the gate insulating layer 304 corresponding to the active layers. An interlayer insulating layer 306 is formed to cover the gates 305 and the exposed gate insulating layer 304.

Specifically, a buffer layer 302 is formed on the flexible substrate layer 301, and the buffer layer is an inorganic buffer layer.

Active layers 303 are respectively formed on the buffer layer 302 corresponding to an area where an island-shaped display block is to be formed and an area where a first island-shaped circuit block is to be formed. That is, a first active layer of a first thin film transistor is formed corresponding to an area where the island-shaped display block is to be formed and a second active layer of a second thin film transistor is formed corresponding to an area where a first island-shaped circuit block is to be formed.

A gate insulating layer 304 is formed to cover the active layers 303 and the exposed buffer layer 302, that is, the gate insulating layer 304 covers the first active layer, the second active layer, and the exposed buffer layer 302.

Gates 305 are formed on the gate insulating layer 304 corresponding to the active layers, that is, a first gate corresponding to the first active layer of the first thin film transistor is formed on the gate insulating layer 304, and a second gate corresponding to the second active layer of the second thin film transistor is formed on the gate insulating layer 304.

An interlayer insulating layer 306 is formed to cover the gates 305 and the exposed gate insulating layer 304. That is, the interlayer insulating layer 306 covers the first gate of the first thin film transistor, the second gate of the second thin film transistor, and the exposed gate insulating layer 304.

A source-drain electrode 307 penetrating the interlayer insulating layer is formed on the interlayer insulating layer 306.

Figure 9B:
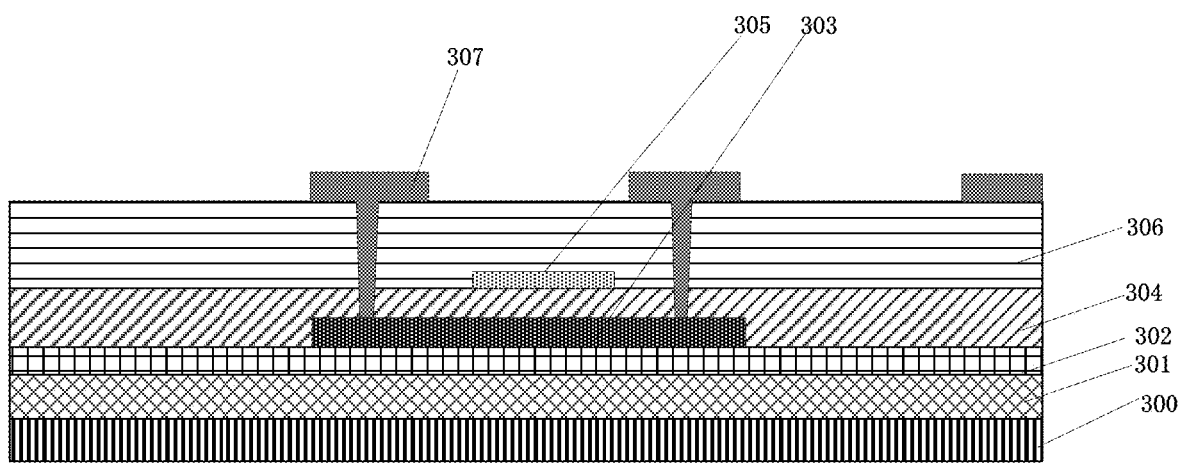

In this embodiment, as shown in FIG. 9b, on the interlayer insulating layer 306, a first source-drain electrode penetrating to the first active layer of the first thin film transistor is formed on an area corresponding to the island-shaped display block, a second source-drain electrode penetrating to the second active layer of the second thin film transistor is formed on an area corresponding to the first island-shaped circuit block, a first power supply signal line is formed on an area corresponding to the second island-shaped circuit block, a second power supply signal line is formed on an area corresponding to the third island-shaped circuit block, a first conductive layer is formed on an area corresponding to the third connection bridge, a second conductive layer is formed on an area corresponding to the fourth connection bridge, and a third conductive layer is formed on an area corresponding to the fifth connection bridge. The first power supply signal line and the second power supply signal line are used to supply power to the light-emitting pixel to be formed, and the first conductive layer and the second conductive layer are used to transmit electrical signals between adjacent island-shaped display blocks and between the island-shaped display block and the island-shaped circuit block, and the third conductive layer is used to transmit electrical signals between adjacent island-shaped circuit blocks.

S22: etching the formed first stack through a patterning process to form a first hollow area exposing the flexible substrate layer.

Specifically, patterning is performed to form a plurality of island-shaped protection blocks arranged in an array, first connection bridges and second connection bridges in the protection area, to form a plurality of island-shaped display blocks arranged in an array, third connection bridges and fourth connection bridges in the display area, and to form a plurality of island-shaped circuit blocks arranged in an array and fifth connection bridges in the circuit area. The flexible substrate layer is exposed among the plurality of island-shaped protection blocks, the plurality of island-shaped display blocks, and the plurality of island-shaped circuit blocks.

Figure 9C:
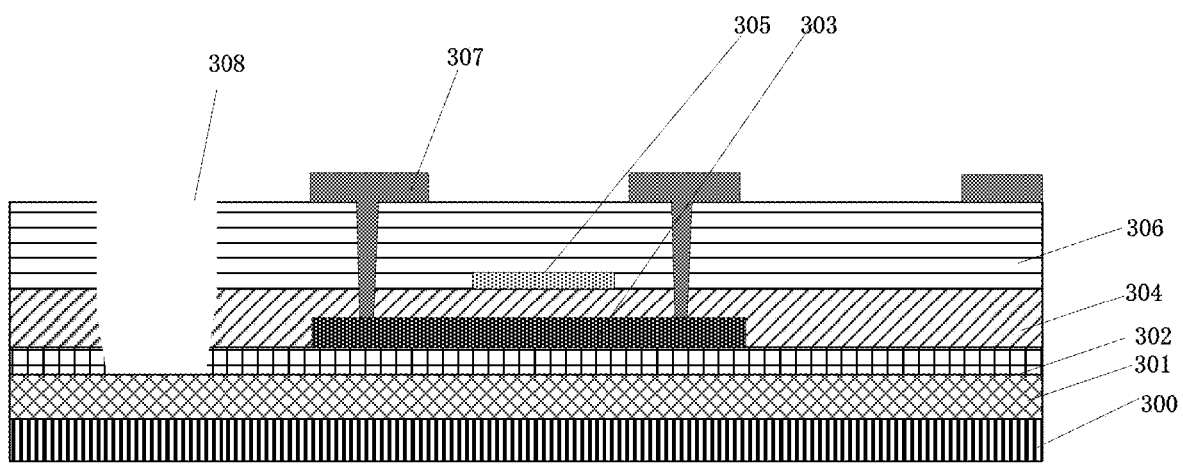

In this embodiment, as shown in FIG. 9c, the first hollow area 308 is formed by patterning. For example, an area other than the first hollow area is covered by a photoresist, and the dry etching is used to directly etch to the flexible substrate layer 301. After the etching is completed, the plurality of island-shaped protection blocks arranged in an array, first connection bridges and second connection bridges are formed in the protection area, the plurality of island-shaped display blocks arranged in an array, third connection bridges and fourth connection bridges are formed in the display area, and the plurality of island-shaped circuit blocks arranged in an array and fifth connection bridges are formed in the circuit area. That is, a structure of a plurality of island-shaped blocks and a plurality of connection bridges arranged in an array of the array substrate is formed.

S23: forming a planarization layer to cover the source-drain electrode, the exposed interlayer insulating layer, and the exposed flexible substrate layer.

Figure 9D:
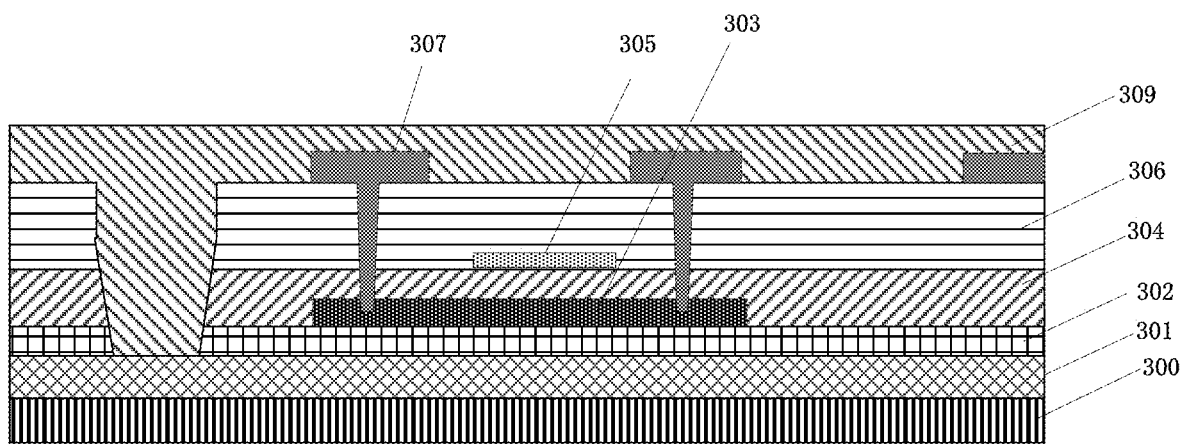

In this embodiment, as shown in FIG. 9d, the planarization layer 309 covering the source-drain electrode 307 specifically includes covering the first source-drain electrode of the first thin film transistor corresponding to the island-shaped display block, the second source-drain electrode of the second thin film transistor corresponding to the first island-shaped circuit block, the first power supply signal line corresponding to the second island-shaped circuit block, the second power supply signal line corresponding to the third island-shaped circuit block, the first conductive layer corresponding to the third connection bridge, the second conductive layer corresponding to the fourth connection bridge, and the third conductive layer corresponding to the fifth connection bridge.

S24: forming an anode electrically connected to the source-drain electrode and a pixel defining layer of a light-emitting pixel on the planarization layer.

Figure 9E:
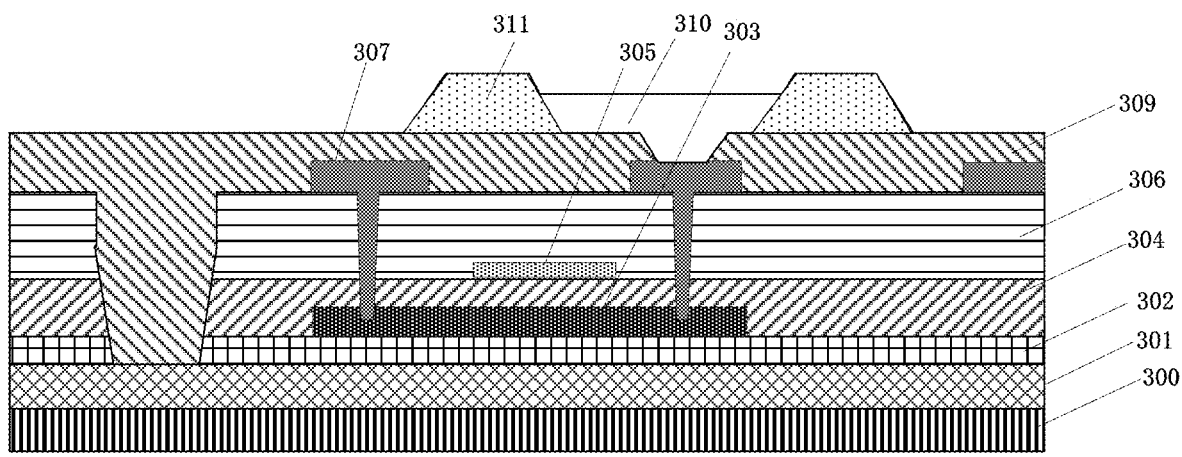

In this embodiment, as shown in FIG. 9e, an anode 310 of a light-emitting pixel is formed on a corresponding area of the planarization layer 309. For example, the pixel defining layer 311 is formed by a patterning process, the planarization layer 309 is punched, and the anode material of the light-emitting pixel is deposited, to form the anode 310 with a size corresponding to the pixel size.

S25: forming a hard mask material layer covering the anode and the pixel defining layer of the light-emitting pixel and the exposed planarization layer to form a second stack.

Figure 9F:
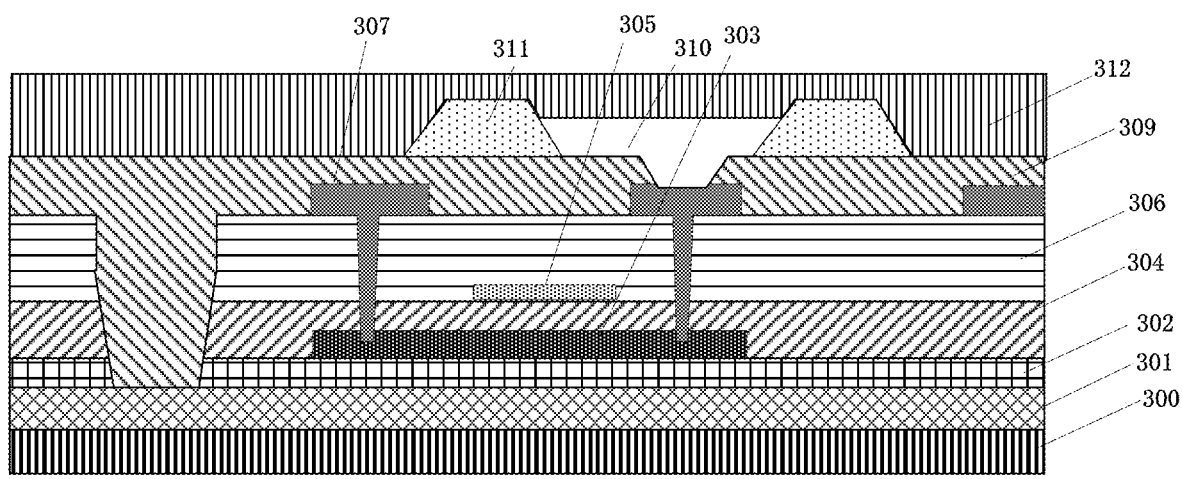

In this embodiment, as shown in FIG. 9f, considering that the organic material (for example, the flexible substrate layer and the planarization layer) in the hollow area to be formed needs to be etched, a hard mask material layer 312 is added, such as SiNx or SiONx, covering the anode and the pixel defining layer of the light-emitting pixel and the exposed planarization layer to form a second stack.

S26: etching the formed second stack through a patterning process to form a second hollow area exposing the rigid substrate.

Figure 9G:
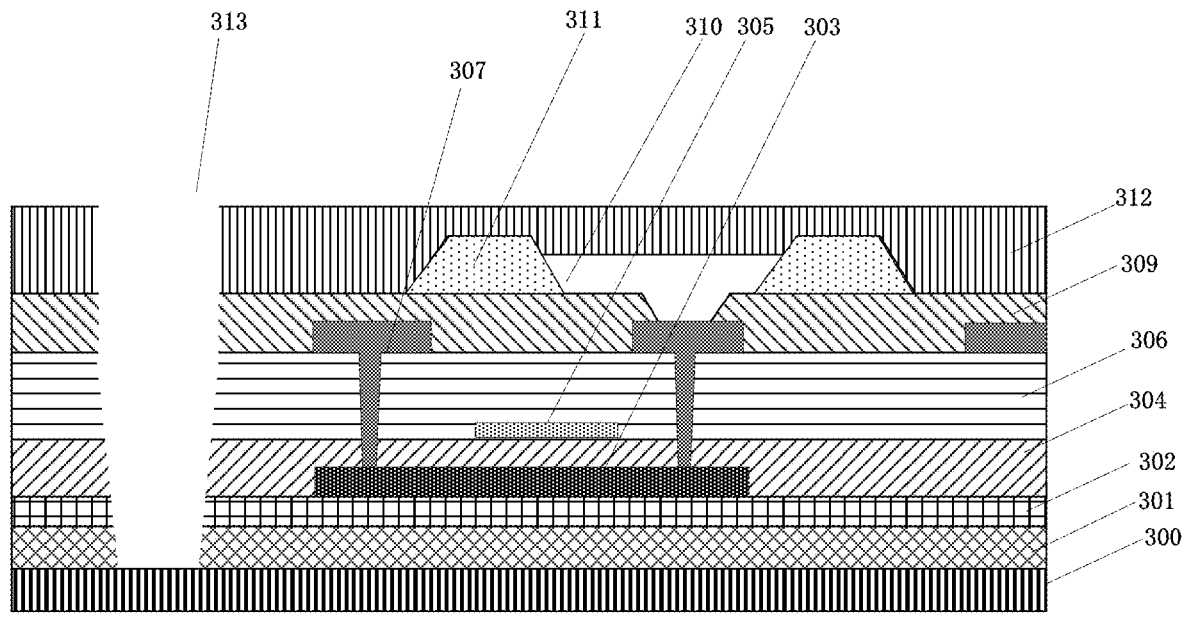

In this embodiment, as shown in FIG. 9g, the second hollow area 313 is formed by patterning. For example, the hard mask material layer corresponding to the second hollow area to be formed is firstly etched away by an exposure and etching process, and then the planarization layer and the flexible substrate layer corresponding to the second hollow area to be formed are etched away by an etching process, thereby forming a second hollow area 313 penetrating to the rigid substrate 300.

S27: etching an area above the anode of the light-emitting pixel to expose the anode, and forming a light emitting layer and a cathode of the light-emitting pixel on the anode.

S28: forming a thin film encapsulation layer.

Figure 9H:
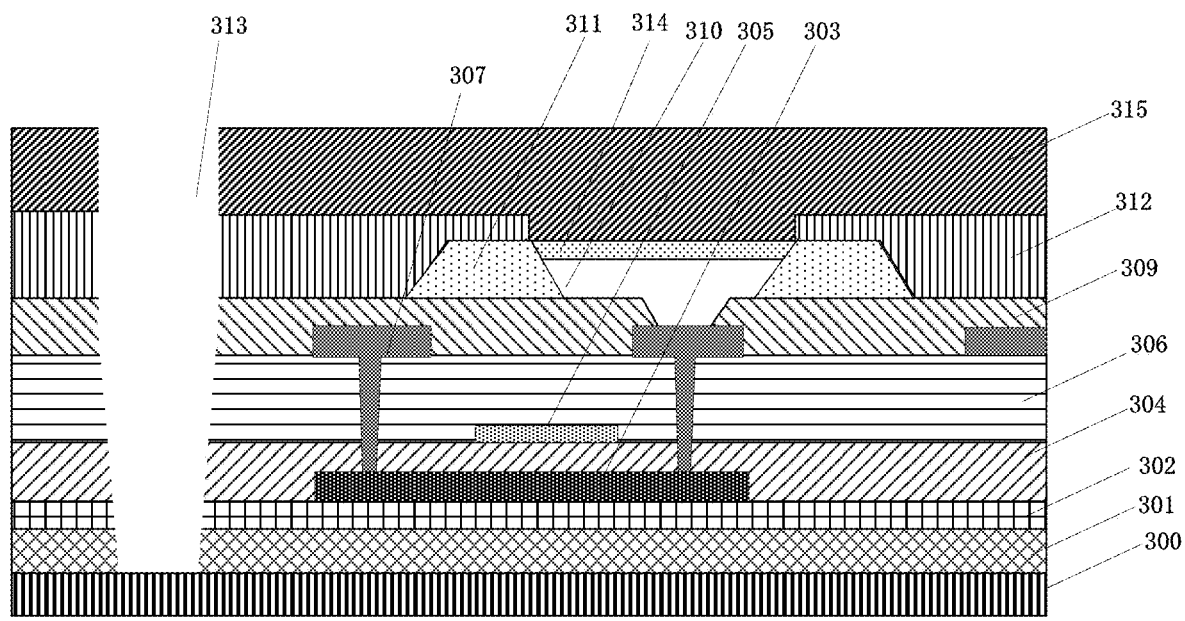

In this embodiment, as shown in FIG. 9h, a light emitting layer and a cathode 314 of the light-emitting pixel are formed. For example, the area corresponding to the light emitting layer and the cathode of the light-emitting pixel (e.g., OLED) to be formed is firstly etched away to expose the anode, and then the light emitting layer and the cathode 314 are evaporated. The array substrate is thin-film encapsulated to form a thin film encapsulation layer 315.

S3: peeling off the rigid substrate.

Considering the overall structure of the array substrate, in an optional embodiment, S3 of peeling off the rigid substrate further includes:

peeling off the rigid substrate 300 from a side of the flexible substrate layer 301 close to the rigid substrate 300.

In this embodiment, as shown in FIG. 6, the rigid substrate 300 is peeled off. For example, the rigid substrate 300 is peeled from the flexible substrate layer 301 by a laser stripping process to form the structure of a plurality of island-shaped blocks and a plurality of connection bridges of the array substrate, which effectively improves the stretch resistance of the array substrate.

Finally, the method may also include S4: after peeling off the rigid substrate, attaching a stretchable support base on a side of the flexible substrate layer close to the rigid substrate.

In this embodiment, as shown in FIG. 7, through an adhesive, a stretchable support base 316 may be attached to a surface of the flexible substrate layer of the island-shaped display blocks, island-shaped circuit blocks, island-shaped protection blocks, first connection bridges, second connection bridges, third connection bridges, fourth connection bridges and fifth connection bridges facing away from the buffer layer 302, so that a structure of the plurality of island-shaped blocks and the plurality of connection bridges of the array substrate can be effectively maintained and supported within a certain stretching range, to facilitate subsequent production and installation.

On the basis of the above array substrate, an embodiment of the present disclosure further provides a stretchable display device including the above array substrate. The display device can withstand external stretch deformation and the display effect and user experience of the display device can be effectively improved.

The present disclosure provides an array substrate, a stretchable display device, and a method for manufacturing an array substrate. The structure of islands and bridges of the island-shaped display blocks, the island-shaped circuit blocks, the island-shaped protection blocks, the first connection bridges, the second connection bridges, the third connection bridges, the fourth connection bridges, and the fifth connection bridges withstands the deformation generated at the display edge when the display device is stretched, effectively alleviating the stretch deformation of the edge position of the display device, thereby remedying the problems in the related art, effectively improving the stretch resistance of the display device and improving the user experience.

It will be understood that, although the terms "first," "second," etc. may be used herein to describe various elements, these elements should not be limited by these terms. These terms are only used to distinguish one element from another. For example, without departing from the scope of the present specification, a first element may be referred to as a second element, and similarly, a second element may be referred to as a first element. In addition, the terms "first," "second," etc. are used for descriptive purposes only, and cannot be understood as indicating or suggesting relative importance or implicitly indicating the number of technical features indicated. Thus, the features defined as "first", "second", etc. may explicitly or implicitly include at least one of the features. In the description of the present disclosure, the meaning of "a plurality" is at least two, for example, two, three, etc., unless it is explicitly and specifically defined otherwise.

The scope of the optional embodiments of the present disclosure comprises additional implementations in which the functions may be performed in an order not shown or discussed, e.g., in a substantially simultaneous manner or in the reverse order, depending on the function involved, which will be understood by those skilled in the art.

Obviously, the above-mentioned embodiments of the present disclosure are merely examples for clearly explaining the present disclosure, and are not intended to limit the implementation of the present disclosure. For those of ordinary skill in the art, based on the above description, there are other different forms of changes or variations, and all implementations cannot be exhausted here. Any obvious changes or variations that belong to the technical solutions of the present disclosure are still within the protection scope of the present disclosure.

What is claimed is:

1. An array substrate comprising:
   a display area;
   a circuit area configured to provide an electrical signal to the display area; and
   a protection area comprising a plurality of island-shaped protection blocks, a plurality of first connection bridges and a plurality of second connection bridges, wherein each of the plurality of first connection bridges is configured to connect two adjacent island-shaped protection blocks of the plurality of island-shaped protection blocks, and the plurality of second connection bridges are configured to connect the protection area and the circuit area, and
   wherein the plurality of first connection bridges comprise a first flexible substrate, and the plurality of second connection bridges comprise a second flexible substrate.

2. The array substrate according to claim 1, wherein the display area comprises a plurality of island-shaped display blocks, a plurality of third connection bridges, and a plurality of fourth connection bridges, each of the plurality of third connection bridges is configured to connect two adjacent island-shaped display blocks of the plurality of island-shaped display blocks, the plurality of fourth connection bridges are configured to connect the display area and the circuit area, the plurality of third connection bridges comprise a third flexible substrate, and the plurality of fourth connection bridges comprise a fourth flexible substrate.

3. The array substrate according to claim 2, wherein each of the plurality of island-shaped display blocks comprises:
   a second island-shaped flexible substrate;
   a pixel driving circuit on the second island-shaped flexible substrate;
   a light-emitting pixel on the pixel driving circuit configured to emit light in response to an electrical signal received from the pixel driving circuit; and
   an encapsulation layer on the light-emitting pixel.

4. The array substrate according to claim 3, wherein the circuit area comprises a plurality of island-shaped circuit blocks, the plurality of island-shaped circuit blocks comprise a first island-shaped circuit block provided with a gate driving circuit, a second island-shaped circuit block configured to provide a first power supply voltage, and a third island-shaped circuit block configured to provide a second power supply voltage, the second island-shaped circuit block comprises a first power supply signal line on the second island-shaped flexible substrate, the third island-shaped circuit block comprises a second power supply signal line on the third island-shaped flexible substrate,
   at least one of the plurality of fourth connection bridges connecting the third island-shaped circuit block and one of the plurality of island-shaped display blocks that is adjacent to the third island-shaped circuit block comprises a first connection wire on the fourth flexible substrate configured to connect the second power supply signal line and the pixel driving circuit and provide the second power supply voltage to the pixel driving circuit;
   at least one of the plurality of fourth connection bridges connecting the second island-shaped circuit block and one of the plurality of island-shaped display blocks that is adjacent to the second island-shaped circuit block comprises a second connection wire on the fourth flexible substrate configured to connect the first power supply signal line and the pixel driving circuit and provide the first power supply voltage to the pixel driving circuit; and
   at least one of the plurality of fourth connection bridges connecting the first island-shaped circuit block and one of the plurality of island-shaped display blocks that is adjacent to the first island-shaped circuit block comprises a third connection wire on the fourth flexible substrate configured to connect the gate driving circuit and the pixel driving circuit and provide a driving signal to the pixel driving circuit.

5. The array substrate according to claim 1, wherein the circuit area comprises a plurality of island-shaped circuit blocks and a plurality of fifth connection bridges, each of the plurality of fifth connection bridges is configured to connect two adjacent island-shaped circuit blocks of the plurality of island-shaped circuit blocks, and the plurality of fifth connection bridges comprise a fifth flexible substrate.

6. The array substrate according to claim 5, wherein the plurality of island-shaped circuit blocks comprise:
   a first island-shaped circuit block provided with a gate driving circuit;
   a second island-shaped circuit block configured to provide a first power supply voltage; and
   a third island-shaped circuit block configured to provide a second power supply voltage.

7. The array substrate according to claim 6, wherein the gate driving circuit comprises a light emitting signal driving circuit and a scanning signal driving circuit, and the first island-shaped circuit block comprises a light emitting signal driving circuit circuit block and a scanning signal driving circuit circuit block.

8. The array substrate according to claim 6, wherein each of the plurality of island-shaped circuit blocks comprises a third island-shaped flexible substrate,
   the first island-shaped circuit block comprises the gate driving circuit on the third island-shaped flexible substrate;
   the second island-shaped circuit block comprises a first power supply signal line on the third island-shaped flexible substrate; and
   the third island-shaped circuit block comprises a second power supply signal line on the third island-shaped flexible substrate.

9. The array substrate according to claim 8, wherein the gate driving circuit comprises a light emitting signal driving circuit and a scanning signal driving circuit, the first island-shaped circuit block comprises a light emitting signal driving circuit circuit block and a scanning signal driving circuit circuit block,
   at least one of the plurality of fifth connection bridges connecting the first island-shaped circuit block and the second island-shaped circuit block that are adjacent comprises a first connection wire on the fifth flexible substrate configured to electrically connect the gate driving circuit and the first power supply signal line that are adjacent and provide the first power supply voltage to the gate driving circuit;

at least one of the plurality of fifth connection bridges connecting adjacent light emitting signal driving circuit circuit blocks comprises a second connection wire on the fifth flexible substrate configured to electrically connect two adjacent light emitting signal driving circuits;

at least one of the plurality of fifth connection bridges connecting adjacent scanning signal driving circuit circuit blocks comprises a third connection wire on the fifth flexible substrate configured to electrically connect two adjacent scanning signal driving circuits;

at least one of the plurality of fifth connection bridges connecting the light emitting signal driving circuit circuit block and the scanning signal driving circuit circuit block that are adjacent comprises a fourth connection wire on the fifth flexible substrate configured to electrically connect the light emitting signal driving circuit and the scanning signal driving circuit that are adjacent and provide a light emitting signal to the scanning signal driving circuit; and at least one of the plurality of fifth connection bridges connecting adjacent third island-shaped circuit blocks comprises a fifth connection wire on the fifth flexible substrate configured to electrically connect two second power supply signal lines of adjacent third island-shaped circuit blocks.

10. The array substrate according to claim 1, further comprising a driver IC, the circuit area being located on the periphery of the display area, the protection area being located on a side of the circuit area away from the display area, and the driver IC being located on a first side of the circuit area away from the display area, and the protection area comprising a first protection area, a second protection area, and a third protection area, wherein the first protection area is located on a second side of the circuit area away from the display area, and the second side is opposite to the first side;

the second protection area and the third protection area are respectively located on a third side and a fourth side of the circuit area away from the display area, and the third side is opposite to the fourth side.

11. The array substrate according to claim 1, wherein each of the plurality of island-shaped protection blocks comprises:

a first island-shaped flexible substrate; and a dielectric layer on the first island-shaped flexible substrate.

12. The array substrate according to claim 11, further comprising a stretchable support base on a side of the first island-shaped flexible substrate facing away from the dielectric layer.

13. The array substrate according to claim 12, wherein the support base is made of PDMS.

14. A stretchable display device comprising the array substrate according to claim 1.

* * * * *